US010854831B2

(12) United States Patent
Choi et al.

(10) Patent No.: US 10,854,831 B2
(45) Date of Patent: Dec. 1, 2020

(54) THIN FILM TRANSISTOR INCLUDING A PAIR OF AUXILIARY STRUCTURES CORRESPONDING TO SOURCE/DRAIN AND METHOD OF MANUFACTURING THE SAME

(71) Applicant: Samsung Electronics Co., Ltd., Suwon-si (KR)

(72) Inventors: Ajeong Choi, Suwon-si (KR); Youngjun Yun, Yongin-si (KR); Yong Uk Lee, Gwangju-si (KR); Suk Gyu Hahm, Gyungju-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 256 days.

(21) Appl. No.: 15/804,279

(22) Filed: Nov. 6, 2017

(65) Prior Publication Data
US 2018/0269413 A1    Sep. 20, 2018

(30) Foreign Application Priority Data
Mar. 17, 2017  (KR) .................... 10-2017-0033971

(51) Int. Cl.
*H01L 51/05*       (2006.01)
*H01L 51/10*       (2006.01)
*H01L 51/00*       (2006.01)

(52) U.S. Cl.
CPC ...... *H01L 51/0558* (2013.01); *H01L 51/0008* (2013.01); *H01L 51/0562* (2013.01); *H01L 51/10* (2013.01); *H01L 51/105* (2013.01); *H01L 51/0074* (2013.01)

(58) Field of Classification Search
CPC ............. H01L 51/0558; H01L 51/0008; H01L 51/0562; H01L 51/10; H01L 51/105
See application file for complete search history.

(56) References Cited

U.S. PATENT DOCUMENTS

| 7,749,921 | B2 | 7/2010 | Mino et al. |
| 7,816,673 | B2 | 10/2010 | Park et al. |
| 8,758,508 | B2 | 6/2014 | Rannou et al. |
| 2008/0142792 | A1* | 6/2008 | Park ..................... C07D 495/22 257/40 |
| 2010/0084643 | A1* | 4/2010 | Hirai ................... H01L 51/0529 257/40 |

(Continued)

FOREIGN PATENT DOCUMENTS

| JP | 4316669 B2 | 8/2009 |
| JP | 2013-058680 A | 3/2013 |

OTHER PUBLICATIONS

See attached STIC search report.*

(Continued)

*Primary Examiner* — Matthew E. Gordon
(74) *Attorney, Agent, or Firm* — Harness, Dickey & Pierce, P.L.C.

(57) ABSTRACT

A thin film transistor includes a pair of auxiliary structures facing each other on a substrate, an active layer including an organic semiconductor and continuously grown between the pair of auxiliary structures, a gate electrode on the substrate and overlapped by the active layer, and a source electrode and a drain electrode electrically connected to the active layer. A method of manufacturing the thin film transistor is disclosed.

14 Claims, 17 Drawing Sheets

(56) References Cited

U.S. PATENT DOCUMENTS

| | | | |
|---|---|---|---|
| 2012/0037915 A1 | 2/2012 | Kugler | |
| 2014/0353647 A1* | 12/2014 | Newsome | H01L 51/0047 257/40 |
| 2015/0123100 A1* | 5/2015 | Lee | H01L 51/0018 257/40 |
| 2016/0226005 A1 | 8/2016 | Park et al. | |
| 2017/0317296 A1* | 11/2017 | Yamamoto | C07D 495/22 |
| 2018/0122585 A1* | 5/2018 | Satou | H01L 51/4253 |

OTHER PUBLICATIONS

J. Rivnay et al., "Quantitative Determination of Organic Semiconductor Microstructure From the Molecular to Device Scale" Chem. Rev. 112, 5488-5519 (2012).

* cited by examiner

THIN FILM TRANSISTOR INCLUDING A PAIR OF AUXILIARY STRUCTURES CORRESPONDING TO SOURCE/DRAIN AND METHOD OF MANUFACTURING THE SAME

CROSS-REFERENCE TO RELATED APPLICATION

This application claims priority under 35 U.S.C. § 119 to Korean Patent Application No. 10-2017-0033971, filed in the Korean Intellectual Property Office on Mar. 17, 2017, and all the benefits accruing therefrom, the entire contents of which are incorporated herein by reference.

BACKGROUND

1. Field

Example embodiments relate to a thin film transistor and/or a method of manufacturing the same.

2. Description of Related Art

A flat panel display such as a liquid crystal display (LCD), an organic light emitting diode (OLED) display, an electrophoretic display, and the like includes a pair of electric field-generating electrodes and an electrical optical active layer interposed therebetween. The liquid crystal display (LCD) includes a liquid crystal layer as an electric optical active layer, and the organic light emitting diode (OLED) display includes an organic emission layer as an electrical optical active layer.

One of the pairs of the electric field-generating electrodes is commonly connected to a switching device and receives an electrical signal, and the electrical optical active layer transforms the electrical signal into an optical signal and thus displays an image.

The flat panel display includes a three-terminal element of a thin film transistor (TFT) as a switch, and it also includes a gate line transferring a scan signal for controlling the thin film transistor and a data line transferring a data signal to be applied to a pixel electrode.

Among the thin film transistors, an organic thin film transistor (OTFT) including an organic semiconductor such as a low molecular compound or a polymer instead of the inorganic semiconductor such as silicon (Si) has been actively researched.

SUMMARY

A low molecular organic semiconductor among the organic semiconductors may be mainly formed through deposition such as thermal evaporation. However, since an organic semiconductor formed through deposition grows in a polycrystal form, a plurality of grain boundaries are present and thus may deteriorate charge mobility. In addition, the organic semiconductor may be formed into a desired (and/or alternatively predetermined) pattern by using a shadow mask during deposition or performing a lithography process after deposited on the whole surface of a substrate, but when the shadow mask is used, the pattern may be less precise, while when the lithography process is used, the process may not only be complex, but the organic semiconductor may also be damaged by a chemical solution used during the process.

Example embodiments provide a thin film transistor capable of improving charge mobility without damaging an organic semiconductor.

Example embodiments also provide a method of manufacturing the thin film transistor.

According to some example embodiments, a method of manufacturing a thin film transistor includes forming a pair of auxiliary structures facing each other on a substrate and forming an active layer between the pair of auxiliary structures on the substrate. The forming the active layer may include thermally evaporating an organic semiconductor to form the active layer continuously grown between the pair of auxiliary structures.

In some example embodiments, the forming the active layer may include performing the thermally evaporating of the organic semiconductor at a substrate temperature of greater than or equal to about 85° C. and a deposition rate of less than about 0.1 Å/s.

In some example embodiments, the forming the active layer may include performing the thermally evaporating of the organic semiconductor at a substrate temperature of about 85° C. to about 100° C. and at a deposition rate of about 0.005 Å/s to about 0.05 Å/s.

In some example embodiments, the forming the active layer may include performing the thermally evaporating of the organic semiconductor at a deposition temperature of greater than or equal to about 125° C.

In some example embodiments, the forming the active layer may include performing the thermally evaporating of the organic semiconductor at a deposition temperature of about 125° C. to about 145° C.

In some example embodiments, the active layer may be a single crystal or single crystal-like active layer.

In some example embodiments, the forming of the pair of auxiliary structures may include forming a thin film for auxiliary structures on the substrate and performing a lithography process on the thin film for the auxiliary structures to form the pair of auxiliary structures facing each other.

In some example embodiments, the forming of the pair of auxiliary structures may be performed to obtain an interval between the pair of auxiliary structures of less than or equal to about 10 μm.

In some example embodiments, the method of manufacturing the thin film transistor may further include surface-treating the pair of auxiliary structures.

In some example embodiments, the method of manufacturing the thin film transistor may further include at least one of forming a gate electrode on the substrate, the gate electrode overlapped by the active layer, and forming a source electrode and a drain electrode electrically connected to the active layer.

According to some example embodiments, a thin film transistor includes a pair of auxiliary structures facing each other on a substrate, an active layer on the substrate and including an organic semiconductor that is contiguous between the pair of auxiliary structures, a gate electrode on the substrate and overlapped by the active layer, and a source electrode electrically connected to the active layer.

In some example embodiments, the active layer may contact the pair of auxiliary structures respectively, and the active layer may continuously be formed from one side of the pair of auxiliary structures to an other side of the pair of auxiliary structures.

In some example embodiments, at least one part of a lower surface of the active layer may contact the pair of auxiliary structures respectively and at least one part of an upper surface of the active layer may contact the source electrode and the drain electrode respectively.

In some example embodiments, the active layer may be a single crystal or single crystal-like active layer.

In some example embodiments, the pair of auxiliary structures may include at least one of a metal, a semi-metal, an inorganic material, or an organic material.

In some example embodiments, an interval between the pair of auxiliary structures may be greater than 0 nm and less than or equal to about 10 μm.

In some example embodiments, the organic semiconductor may be a deposition-type organic semiconductor.

In some example embodiments, the organic semiconductor may include a structure represented by Chemical Formula 1 or 2.

[Chemical Formula 1]

[Chemical Formula 2]

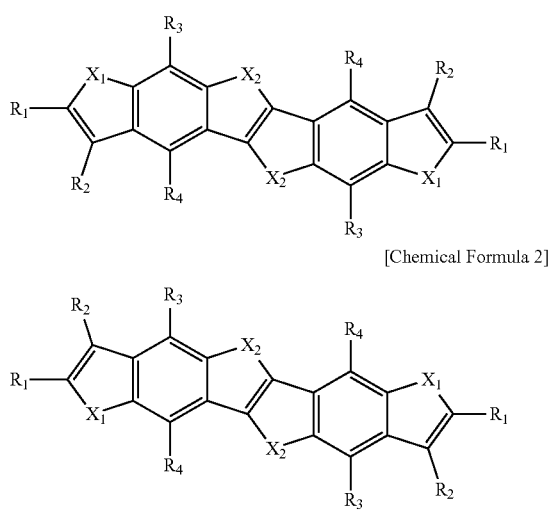

In Chemical Formula 1 or 2, $X_1$ and $X_2$ are independently S, Se, or Te, and $R_1$ to $R_4$ are independently hydrogen, a substituted or unsubstituted C1 to C30 alkyl group, a substituted or unsubstituted C2 to C30 alkenyl group, a substituted or unsubstituted C6 to C30 aryl group, a substituted or unsubstituted C3 to C30 heteroaryl group, or a combination thereof.

According to some example embodiments, thin film transistor may include a substrate, a gate electrode on the substrate, a pair of auxiliary structures on the substrate, an active layer on the substrate, a gate insulating layer on the substrate, and a surface treatment layer on the substrate. The pair of auxiliary structures may include a first auxiliary structure spaced apart from a second auxiliary very structure. The active layer may include an organic semiconductor between the first auxiliary structure and the second auxiliary structure. The gate insulating layer may be between the active layer and the gate electrode. The gate insulating layer may extend between the gate electrode and the pair of auxiliary structures. The surface treatment layer may be between the active layer and the gate insulating layer. The surface treatment layer may be between the first auxiliary structure and the second auxiliary structure.

In some example embodiments, an interval between the pair of auxiliary structures may be greater than 0 nm and less than or equal to about 10 μm.

In some example embodiments, the organic semiconductor may include a structure represented by Chemical Formula 1 or 2.

[Chemical Formula 1]

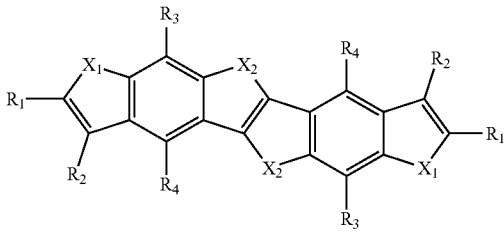

[Chemical Formula 2]

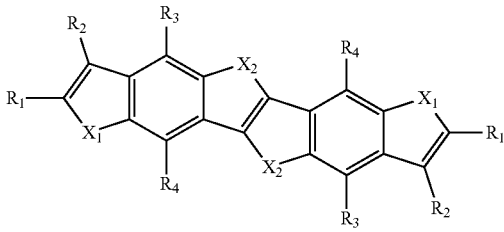

In Chemical Formula 1 or 2, $X_1$ and $X_2$ are independently S, Se, or Te, and $R_1$ to $R_4$ are independently hydrogen, a substituted or unsubstituted C1 to C30 alkyl group, a substituted or unsubstituted C2 to C30 alkenyl group, a substituted or unsubstituted C6 to C30 aryl group, a substituted or unsubstituted C3 to C30 heteroaryl group, or a combination thereof.

In some example embodiments, the pair of auxiliary structures may include at least one of a metal, a semi-metal, an inorganic material, or an organic material.

In some example embodiments, the surface treatment layer may include at least one of a silane compound or a thiol compound.

According to some example embodiments, an electronic device including the thin film transistor is provided.

Charge mobility may be improved without a damage of an organic semiconductor.

DETAILED DESCRIPTION

Example embodiments will hereinafter be described in detail, and, based on the disclosure that follows, may be easily performed by those who have common knowledge in the related art. However, inventive concepts may be embodied in many different forms and is not to be construed as limited to the example embodiments set forth herein.

When a definition is not otherwise provided, "substituted" refers to replacement of hydrogen of a compound by a halogen atom (e.g., F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when specific definition is not otherwise provided, "hetero" refers to one including 1 to 3 heteroatoms selected from N, O, S, Se, and P.

Hereinafter, thin film transistors according to some example embodiments are described.

Figure 1:
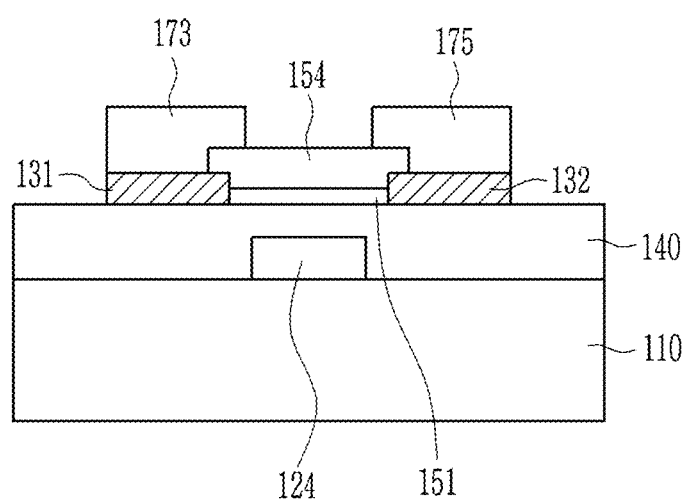
FIG. 1 is a cross-sectional view showing a thin film transistor according to some example embodiments.
Figure 2:
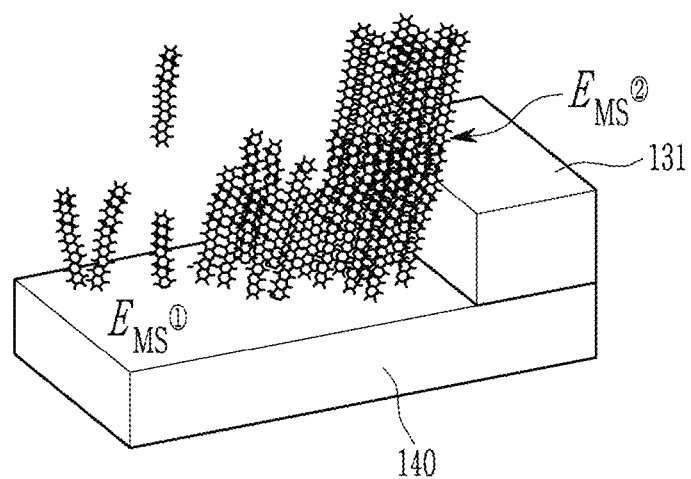
FIG. 2 is a schematic view showing examples of selective deposition of an organic semiconductor in the thin film transistor of FIG. 1, FIGS. 3 to 7 are cross-sectional views showing a manufacturing method of the thin film transistor of FIG. 1.

FIG. 1 is a cross-sectional view showing a thin film transistor according to some example embodiments and FIG. 2 is a schematic view showing examples of selective depositions of an organic semiconductor in the thin film transistor of FIG. 1.

Referring to FIG. 1, a thin film transistor according to some example embodiments includes a substrate 110, a gate electrode 124, a gate insulating layer 140, a pair of auxiliary structures 131 and 132, a surface treatment layer 151, an active layer 154, a source electrode 173, and a drain electrode 175.

The substrate 110 may be for example a transparent glass, an insulation substrate such as polymer, or a silicon wafer. The polymer may include for example polyethylene terephthalate, polyethylene naphthalate, polycarbonate, polyacrylate, polyimide, or a combination thereof, but is not limited thereto. Alternatively, the substrate 110 may be a conductive substrate (e.g., metal or metal alloy) that may function as the gate electrode, in which case the gate electrode 124 may be omitted.

As shown in FIG. 1, the gate electrode 124 is formed on the substrate 110. The gate electrode 124 is connected to a gate line (not shown) for transferring a gate signal. The gate electrode 124 may be made of gold (Au), copper (Cu), nickel (Ni), aluminum (Al), molybdenum (Mo), chromium (Cr), tantalum (Ta), titanium (Ti), an alloy thereof, or a combination thereof, but is not limited thereto. However, when the substrate 110 is a silicon wafer, the gate electrode 124 may be a doping region of the silicon wafer.

A gate insulating layer 140 is formed on the gate electrode 124.

The gate insulating layer 140 may be made of an organic material and/or an inorganic material. Examples of the organic material may include a compound such as a polyvinyl alcohol-based compound, a polyimide-based compound, a polyacryl-based compound, a polystyrene-based compound, a benzocyclobutane (BCB), and the like, and examples of the inorganic material may include a silicon nitride ($SiN_x$) and a silicon oxide ($SiO_2$). The gate insulating layer 140 may include for example one layer or two or more layers.

A pair of auxiliary structures 131 and 132 facing each other are formed on the gate insulating layer 140. The pair of auxiliary structures 131 and 132 facing each other may have an island shape and may be disposed in plural along a row and/or a column on the gate insulating layer 140.

The pair of auxiliary structures 131 and 132 faces each other with a desired (and/or alternatively predetermined) interval and provides a region where an organic semiconductor that will be described later is deposited. For example, the organic semiconductor may be selectively deposited at least a part of and/or around the pair of auxiliary structures 131 and 132 due to a mutual energy (interaction) difference between a region where the pair of auxiliary structures 131 and 132 are formed and the organic semiconductor and between a region where the pair of auxiliary structures 131 and 132 are not formed, that is, for example where the gate insulating layer 140 is exposed and the organic semiconductor.

For example, the organic semiconductor may respectively start to grow from the surface of or around one of the pair of auxiliary structures 131 and 132 and the surface of or around the other of the pair of auxiliary structures 131 and 132 and meet each other between the pair of auxiliary structures 131 and 132 and thus form the active layer 154 having a desired (and/or alternatively predetermined) pattern.

For example, referring to FIG. 2, when the organic semiconductor is deposited on the pair of auxiliary structures 131 and 132 and the gate insulating layer 140, the mutual energy ($E_{MS}^{②}$) between the surface of one of the pair of auxiliary structures 131 and 132 and the organic semiconductor may differ from the mutual energy ($E_{MS}^{①}$) between the surface of the gate insulating layer 140 and the organic semiconductor. For example, deposition selectivity of the organic semiconductor may be determined by a nucleation energy difference between a region for deposition and a region for non-deposition, and the nucleation energy difference may be larger, as the mutual energy ($E_{MS}^{②}$) between one surface of the auxiliary structures 131 and 132 and the organic semiconductor has a larger difference from the mutual energy ($EMS^{①}$) between the surface of the gate insulating layer 140 and the organic semiconductor. Herein, the region where the organic semiconductor is not deposited is assumed as the surface of the gate insulating layer 140 but is not limited thereto and may be other layers.

For example, the nucleation energy difference of the organic semiconductor may be expressed by Relationship Equation 1.

$$\Delta \text{Nucleation Energy} \propto \frac{(E_{MS}^{\;\;\circled{2}} - E_{MS}^{\;\;\circled{1}})}{\phi} \qquad \text{[Relationship Equation 1]}$$

In Relationship Equation 1,

Δ Nucleation Energy is a difference between a region where the organic semiconductor is deposited and a region where the organic semiconductor is not deposited, $E_{MS}^{\;\;\circled{1}}$ is mutual energy between the region where the organic semiconductor is not deposited and the organic semiconductor, $E_{MS}^{\;\;\circled{2}}$ is mutual energy between one surface of the auxiliary structures 131 and 132 and the organic semiconductor, and φ is a deposition rate of the organic semiconductor.

Referring to Relationship Equation 1, deposition selectivity of the organic semiconductor may be larger, as mutual energy ($E_{MS}^{\;\;\circled{2}}$) between one surface of the auxiliary structures 131 and 132 and the organic semiconductor and mutual energy (EMS$^{\circled{1}}$) between a region where the organic semiconductor is not deposited like the surface of the gate insulating layer 140 has a larger difference and as the organic semiconductor is deposited at a slower deposition rate.

The pair of auxiliary structures 131 and 132 may have a space of less than or equal to about 10 µm. Within the range, the space may be for example in a range of about 2 µm to about 10 µm. When the pair of auxiliary structures 131 and 132 has a space within the range, the organic semiconductor may be formed into the active layer 154 having a desired (and/or alternatively predetermined) pattern through a consecutive growth between the pair of auxiliary structures 131 and 132.

The surface of the pair of auxiliary structures 131 and 132 and/or the gate insulating layer 140 may be for example surface-treated. The surface treatment may change surface energy and further increase deposition selectivity of the organic semiconductor.

The pair of auxiliary structures 131 and 132 may be for example a metal, a semi-metal, an inorganic material, and/or an organic material, and for example include one layer or two or more layers.

The active layer 154 is formed on at least a part of the upper surface of the pair of auxiliary structures 131 and 132 and between the pair of auxiliary structures 131 and 132.

The active layer 154 is overlapped with the gate electrode 124 and selectively formed on at least a part of the upper surface of and between the pair of auxiliary structures 131 and 132.

The active layer 154 includes an organic semiconductor and may be a for example, a single crystal or single crystal-like active layer due to the organic semiconductor selectively grown as described above.

The organic semiconductor may continuously grow between the pair of auxiliary structures 131 and 132.

The active layer 154 may respectively contact at least a part of the pair of auxiliary structures 131 and 132, and specifically at least a part of the lower surface of the active layer 154 may respectively contact at least of a part of the pair of auxiliary structures 131 and 132.

The active layer 154 may be continuously formed from one surface of the pair of auxiliary structures 131 and 132 to the other surface of the pair of auxiliary structures 131 and 132.

For example, at least a part of the lower surface of the active layer 154 may respectively contact at least a part of the pair of auxiliary structures 131 and 132.

The organic semiconductor may be for example a deposition-type organic semiconductor, for example a heteroacene compound.

The organic semiconductor may be for example a compound represented by Chemical Formula 1 or 2, but is not limited thereto.

[Chemical Formula 1]

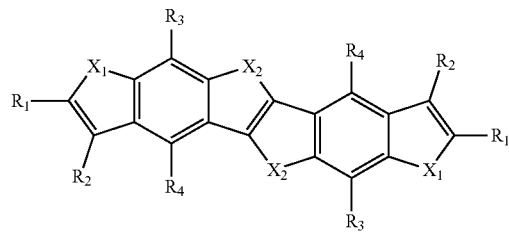

[Chemical Formula 2]

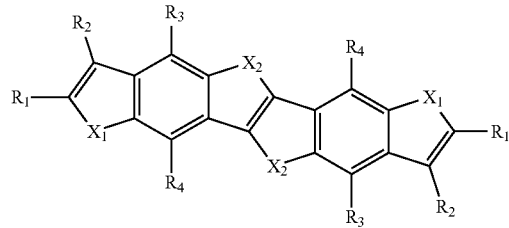

In Chemical Formula 1 or 2, $X_1$ and $X_2$ are independently S, Se, or Te, and $R_1$ to $R_4$ are independently hydrogen, a substituted or unsubstituted C1 to C30 alkyl group, a substituted or unsubstituted C2 to C30 alkenyl group, a substituted or unsubstituted C6 to C30 aryl group, a substituted or unsubstituted C3 to C30 heteroaryl group, or a combination thereof.

The organic semiconductor may be for example represented by Chemical Formula 1a or 2a, but is not limited thereto.

[Chemical Formula 1a]

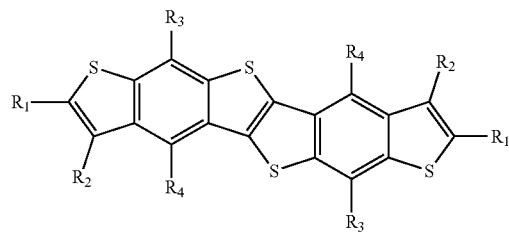

[Chemical Formula 2a]

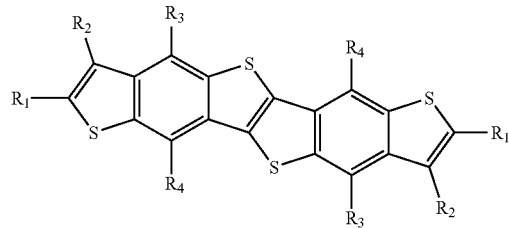

In Chemical Formula 1a or 2a, $R_1$ to $R_4$ are the same as above.

The organic semiconductor may be for example one of compounds of Group 1, but is not limited thereto.

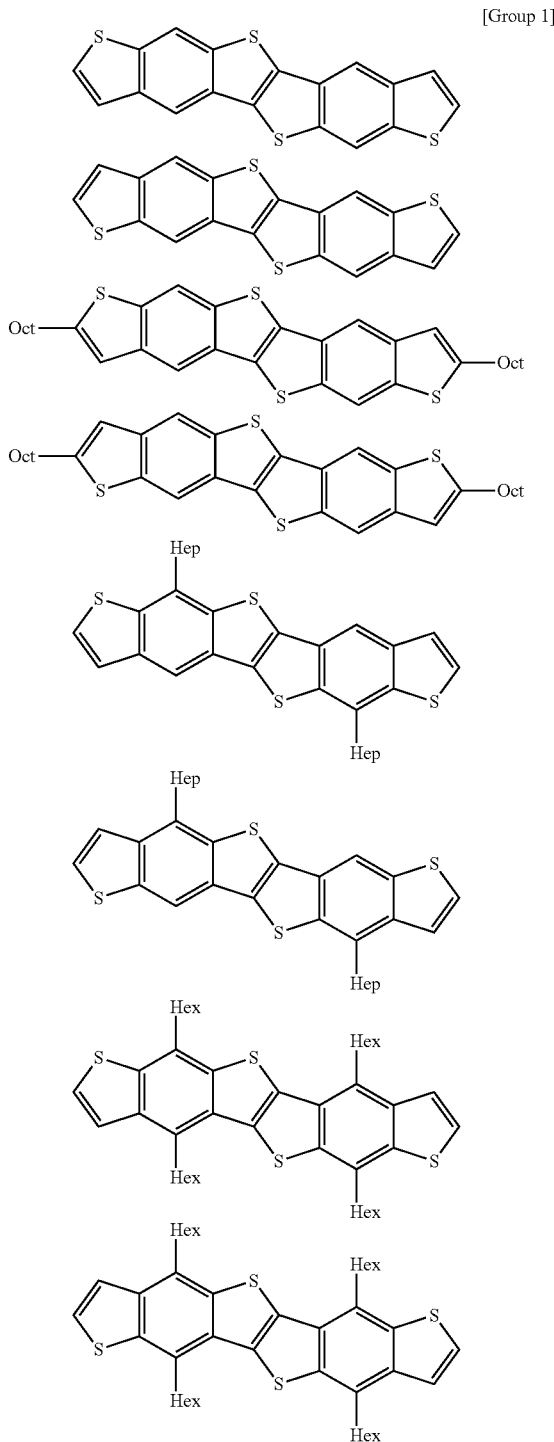

[Group 1]

In Group 1, Hex, Hep, and Oct are a hexyl group, a heptyl group, and an octyl group respectively.

The surface treatment layer 151 is formed under the active layer 154. The surface treatment layer 151 may include a silane compound such as octadecyltrichlorosilane (ODTS) and/or a thiol compound, but is not limited thereto.

The source electrode 173 and the drain electrode 175 are formed on the active layer 154. The source electrode 173 and the drain electrode 175 face each other with the active layer 154 therebetween. The source electrode 173 is electrically connected to the data line (not shown) transferring the data signal. The source electrode 173 and the drain electrode 175 may be made of gold (Au), copper (Cu), nickel (Ni), aluminum (Al), molybdenum (Mo), chromium (Cr), tantalum (Ta), titanium (Ti), an alloy thereof, or a combination thereof.

Hereinafter, a method of manufacturing a thin film transistor according to some example embodiments is described.

FIGS. 3 to 7 are cross-sectional views showing a manufacturing method of the thin film transistor of FIG. 1.

Figure 3:
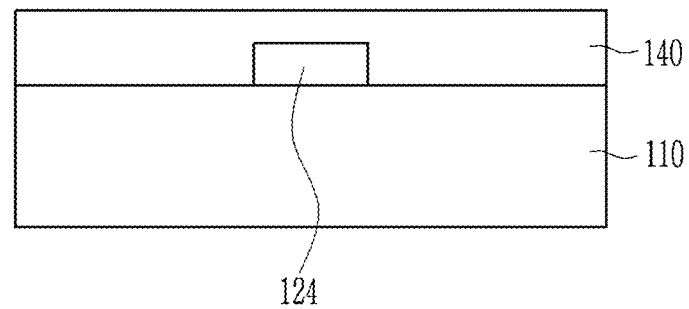

Referring to FIG. 3, a conductive layer is disposed on the substrate 110 and photo-etched to form the gate electrode 124. Subsequently, on the gate electrode 124, the gate insulating layer 140 is formed by depositing silicon oxide ($SiO_2$), silicon nitride (SiNx), or an organic insulator.

Figure 4:
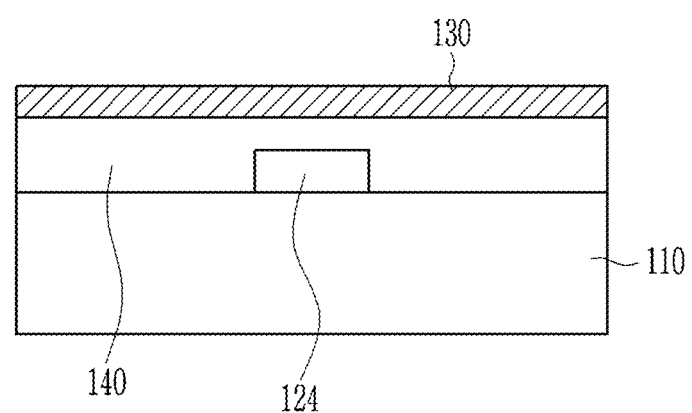

Then, referring to FIG. 4, a thin film 130 for auxiliary structures is formed on the whole surface of the gate insulating layer 140. The thin film 130 for auxiliary structures may include for example a metal, a semi-metal, an oxide, a nitride, and/or an organic material, and for example be formed through a deposition or solution process.

Figure 5:
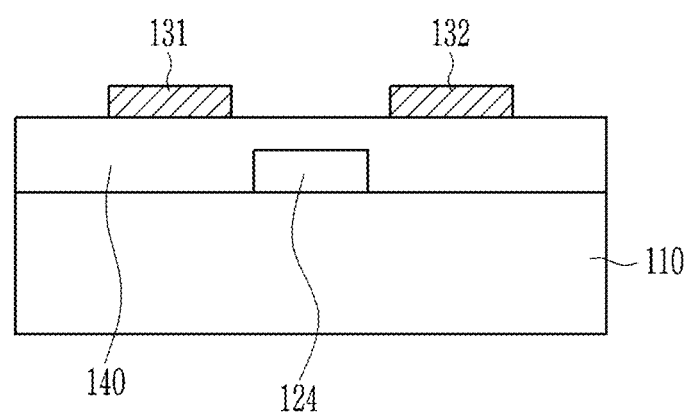

Subsequently, referring to FIG. 5, a plurality of the pair of auxiliary structures 131 and 132 are formed on the thin film 130 for auxiliary structures by coating and patterning a photosensitive layer (not shown) to form a photosensitive pattern and then, by using the photosensitive pattern as a mask to photo-etch the thin film 130 for auxiliary structures.

Figure 6:
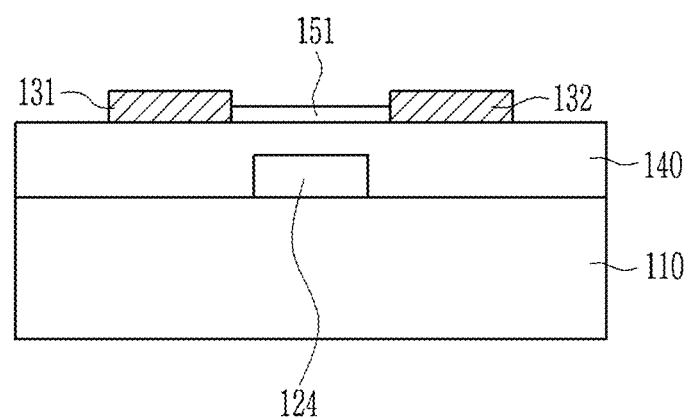

Then, referring to FIG. 6, the pair of auxiliary structures 131 and 132 may be for example surface-treated by oxygen plasma. Subsequently, on the gate insulating layer 140, the surface treatment layer 151 is formed. The surface treatment layer 151 may be selectively formed on the gate insulating layer 140 and for example include a silane compound such as octadecyltrichlorosilane (ODTS) and/or a thiol compound.

Figure 7:
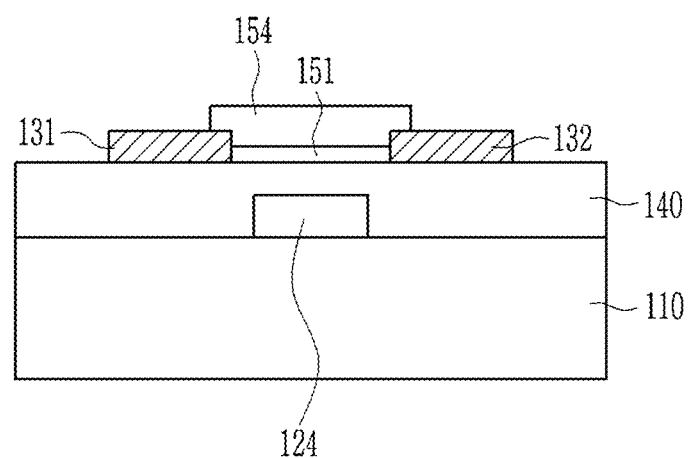

Referring to FIG. 7, an organic semiconductor is thermally evaporated to form the active layer 154 overlapped with the gate electrode 124 and contiguous between the pair of auxiliary structures 131 and 132. The organic semiconductor is continuously grown between the pair of auxiliary structures 131 and 132. The organic semiconductor respectively starts to grow from one surface of or around the pair of auxiliary structures 131 and 132 and then, grows and meets between the pair of auxiliary structures 131 and 132 and thus may be selectively deposited in a region contacting at least a part of and around the pair of auxiliary structures 131 and 132.

Herein, deposition selectivity of the organic semiconductor may be determined by a thermal evaporation condition of the organic semiconductor, for example, increased at a relatively high temperature and a relatively slow deposition rate during the thermal evaporation.

For example, the thermally evaporating of the organic semiconductor may be performed at a substrate temperature of greater than or equal to about 85° C. and a deposition rate of less than about 0.1 Å/s. Herein, the substrate temperature means an actual temperature of a substrate during the thermally evaporating. The thermally evaporating may be performed at a deposition temperature of greater than or equal to about 125° C. in order to obtain the substrate temperature.

For example, the thermally evaporating of the organic semiconductor may be performed at a substrate temperature of about 85° C. to about 100° C. and a deposition rate of about 0.005 Å/s to about 0.05 Å/s. The thermally evaporating may be performed at a deposition temperature of about 125° C. to about 145° C. in order to obtain the substrate temperature.

The active layer 154 may be a single crystal or single crystal-like active layer by continuously growing the organic semiconductor.

Next, referring to FIG. 1, a conductive layer is laminated on the active layer 154. Then, a photolithography and patterning operation (e.g., etching) may be performed to form a source electrode 173 and a drain electrode 175 from the conductive layer.

Modifications to the method described in FIGS. 3 to 7 may be made. For example, if the substrate 110 is a conductive material (e.g., metal or metal alloy), then the substrate may be used as the gate electrode and the operation for forming the gate electrode 124 may be omitted. Alternatively, if the substrate is a semiconductor (e.g., silicon substrate), then the gate electrode 124 may be formed as a doped region in the semiconductor substrate 110.

Figure 8:
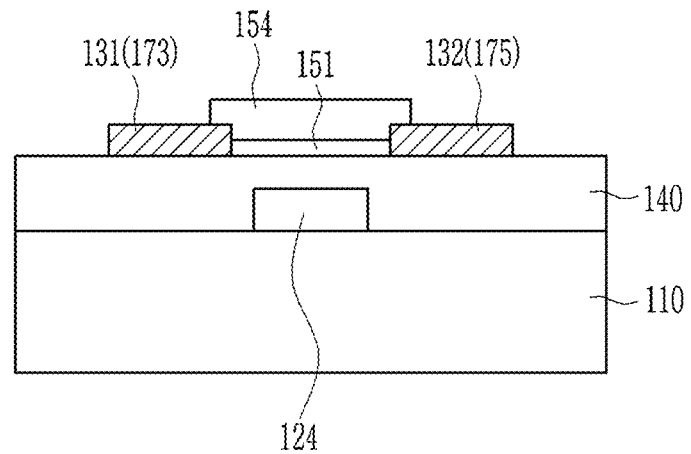
FIG. 8 is a cross-sectional view showing a thin film transistor according to some example embodiments.

FIG. 8 is a cross-sectional view showing a thin film transistor according to some example embodiments.

Referring to FIG. 8, a thin film transistor according to some example embodiments includes a substrate 110, a gate electrode 124, a gate insulating layer 140, a pair of auxiliary structures 131 and 132, a surface treatment layer 151, and an active layer 154 like the thin film transistor described in FIG. 1.

However, the thin film transistor shown in FIG. 8 does not include a source electrode 173 and a drain electrode 175 separately. The pair of auxiliary structures 131 and 132 function as a source electrode and a drain electrode.

Herein, the pair of auxiliary structures 131 and 132 may be for example made of a metal in order to play a role of a source electrode and a drain electrode.

Although an organic thin film transistor having a bottom gate structure has been described as a an example thin film transistor, inventive concepts not limited thereto, and it may be applied to all organic thin film transistors such as a thin film transistor having a top gate structure and/or a thin film transistor having a double-gate structure (e.g., a top gate and a bottom gate).

The thin film transistor may be applied to a switching or driving device of various electronic devices, and the electronic device may be, for example, a liquid crystal display (LCD), an organic light emitting diode (OLED) display, an electrophoretic display device, a solar cell, or an organic sensor.

Hereinafter, inventive concepts are described in more detail with reference to examples. However, these examples are non-limiting, and inventive concepts are not limited thereto.

Manufacture of Thin Film Transistor

EXAMPLE 1

A Ti (50 Å)/Au (350 Å) metal layer is formed by sequentially depositing titanium (Ti) and gold (Au) on a silicon wafer substrate having a gate electrode formed therein and covered with 3000 Å-thick $SiO_2$. On the metal layer, a photosensitive layer is coated and cured and then, patterned to form a pair of auxiliary structure. The surface of the pair of auxiliary structures is activated by performing oxygen plasma (100 W, 30 seconds). Subsequently, the substrate is dipped in a solution obtained by diluting octadecyltrichlorosilane (ODTS) in hexane to have 5 mM of a concentration and allowed to stand for one hour. Then, the substrate is taken therefrom, treated with hexane and ethanol to remove a non-reacted material, and heat-treated. Subsequently, 1000 Å-thick active layer is formed by thermally depositing the following organic semiconductor at a deposition temperature of 130° C. (a substrate temperature of 90° C.) at a deposition rate of 0.01 Å/s, ultimately manufacturing a thin film transistor.

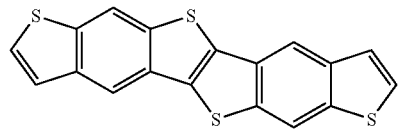 [SMILES: c1cc2cc3c(cc2s1)sc1c2cc4ccsc4cc2sc31]

EXAMPLE 2

A Ti (50 Å)/Au (350 Å) metal layer is formed by sequentially depositing titanium (Ti) and gold (Au) on a silicon wafer substrate having a gate electrode formed therein and covered with 3000 Å-thick $SiO_2$ over the gate electrode and substrate. On the metal layer, a photosensitive layer is coated and cured and then, patterned to form a pair of auxiliary structure. Subsequently, the surface of the pair of auxiliary structure is activated by performing oxygen plasma (100 W, 30 seconds). The substrate is dipped in a solution by diluting octadecyltrichlorosilane (ODTS) in hexane to have a concentration of 5 mM and allowed to stand for one hour. Subsequently, the substrate is taken therefrom, treated with hexane and ethanol to remove a non-reacted material, and heat-treated. Then, the semiconductor is thermally evaporated at a deposition temperature of 130° C. (a substrate temperature of 90° C.) at a deposition rate of 0.01 Å/s to form a 1000 Å-thick active layer. On the active layer, gold (Au) is deposited to be 1000 Å thick and treated through photolithography to form a source electrode and a drain electrode having a larger area than the auxiliary structure and ultimately, manufacture a thin film transistor.

Comparative Example 1

A silicon wafer substrate having a gate electrode formed therein and covered with 3000 Å-thick $SiO_2$ is exposed to $O_2$ plasma (100 W, 30 seconds) and then, dipped in a octadecyltrichlorosilane solution diluted in hexane to have a concentration of 5 mMol and allowed to stand for 1 hour. Subsequently, the substrate is taken therefrom, treated with hexane and ethanol to remove a non-reacted material, and heat-treated. Then, the organic semiconductor is thermally evaporated to be 300 Å thick to form a thin film for an active layer, and a photosensitive layer is coated and cured and then, dry-etched to form an active layer. After removing the photosensitive layer, a source electrode and a drain electrode are formed by depositing gold (Au) to be 1000 Å thick and treating it through photolithography, ultimately manufacturing a thin film transistor.

Comparative Example 2

A thin film transistor is manufactured according to the same method as Example 1 except for thermally depositing the organic semiconductor at a deposition temperature of 120° C. (a substrate temperature of 80° C.) at a deposition rate of 0.01 Å/s.

Comparative Example 3

A thin film transistor is manufactured according to the same method as Example 1 except for thermally depositing the organic semiconductor at a deposition temperature of 150° C. (a substrate temperature of 105° C.) at a deposition rate of 0.05 Å/s.

Comparative Example 4

A thin film transistor is manufactured according to the same method as Example 1 except for thermally depositing the organic semiconductor at a deposition temperature of 150° C. (a substrate temperature of 105° C.) at a deposition rate of 0.1 Å/s.

Comparative Example 5

A thin film transistor is manufactured according to the same method as Example 1 except for thermally depositing the organic semiconductor at a deposition temperature of 150° C. (a substrate temperature of 105° C.) at a deposition rate of 0.01 Å/s.

Evaluation I

A selective deposition of each active layer in the thin film transistors according to Example 1 and Comparative Examples 2 to 5 is evaluated.

Figure 9:
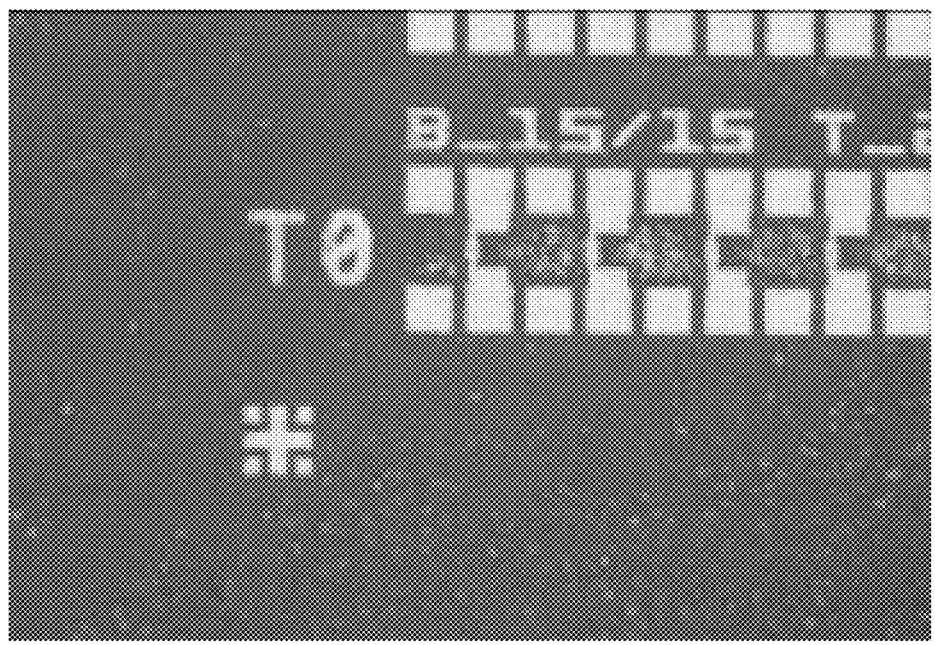
FIG. 9 is a 50× magnification photograph of the active layer region of the thin film transistor according to Example 1.
Figure 10:
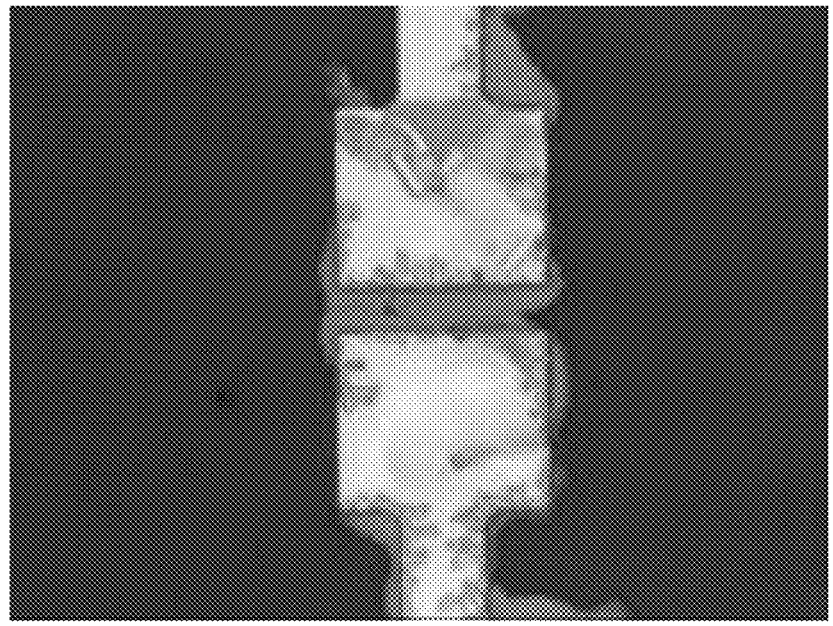
FIG. 10 is a 1000× magnification photograph of the active layer region of the thin film transistor according to Example 1.
Figure 11:
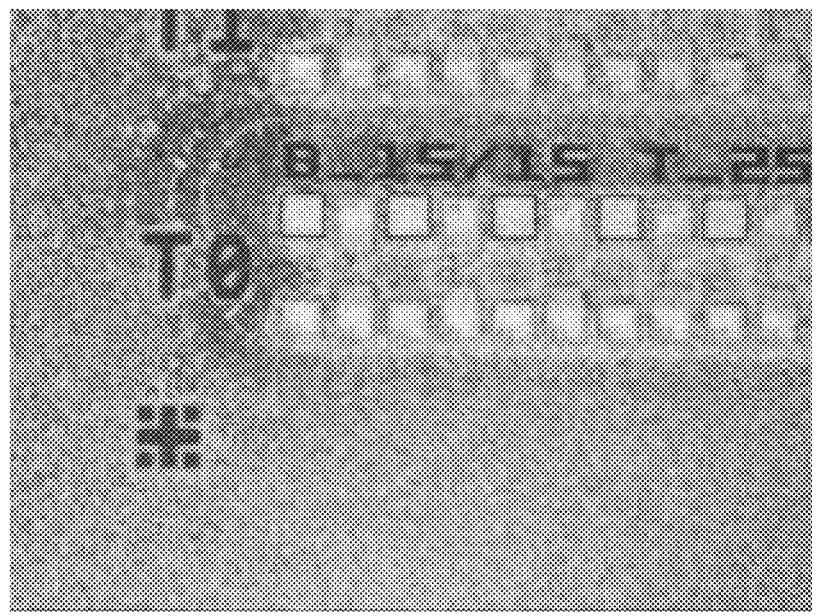
FIG. 11 is a 50× magnification photograph of the active layer region of the thin film transistor according to Comparative Example 2.
Figure 12:
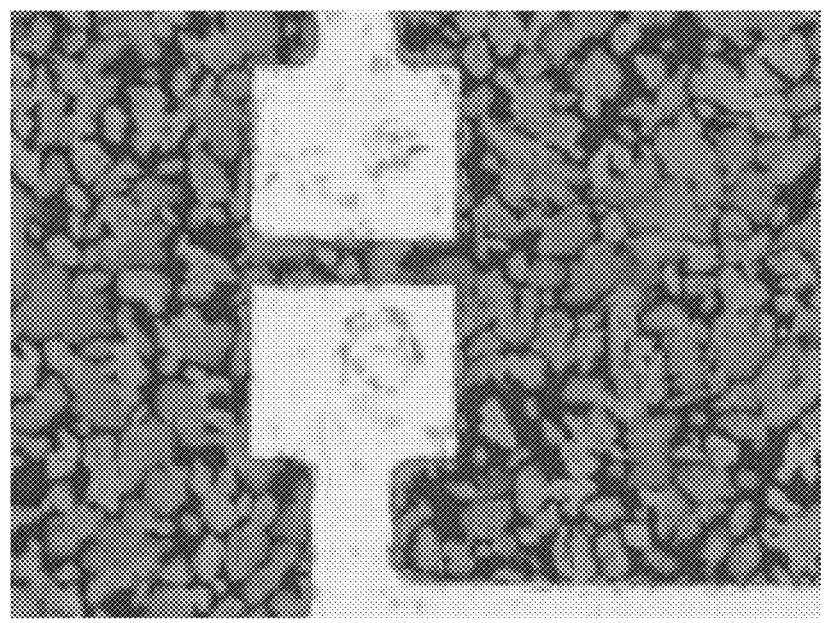
FIG. 12 is a 1000× magnification photograph of the active layer region of the thin film transistor according to Comparative Example 2.
Figure 13:
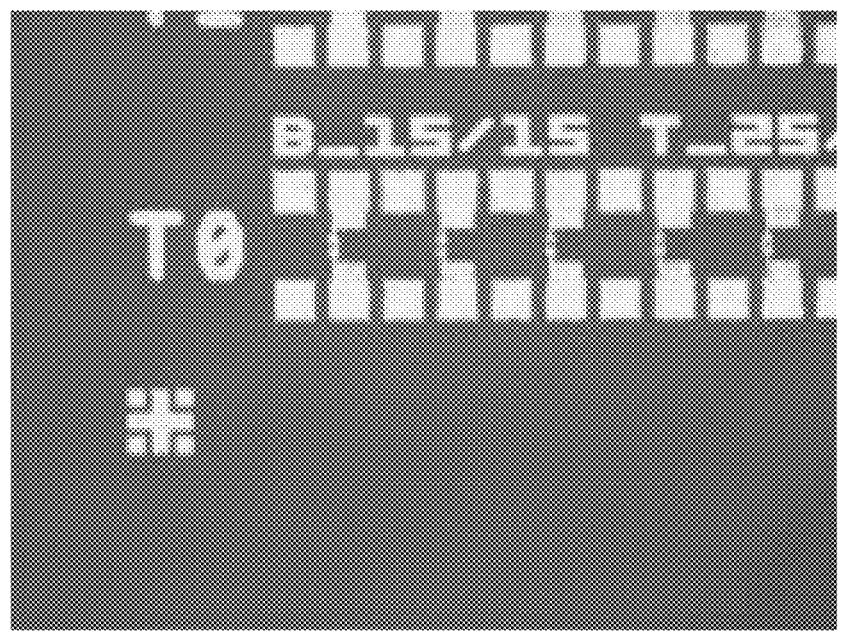
FIG. 13 is a 50× magnification photograph of the active layer region of the thin film transistor according to Comparative Example 3.
Figure 14:
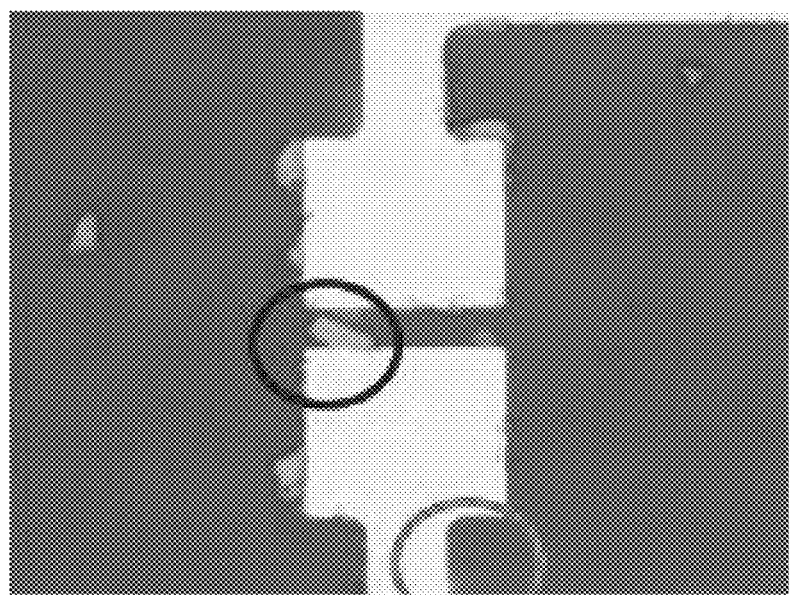
FIG. 14 is a 1000× magnification photograph of the active layer region of the thin film transistor according to Comparative Example 3.
Figure 15:
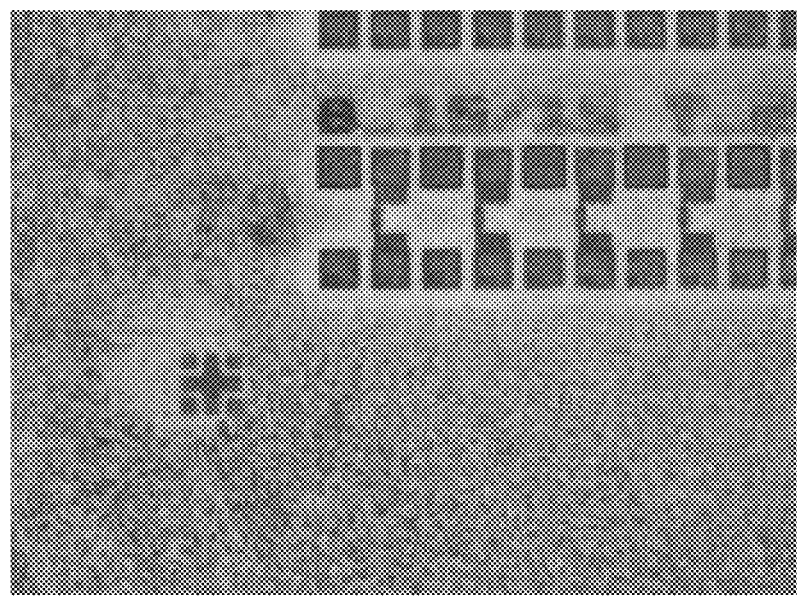
FIG. 15 is a 50× magnification photograph of the active layer region of the thin film transistor according to Comparative Example 4.
Figure 16:
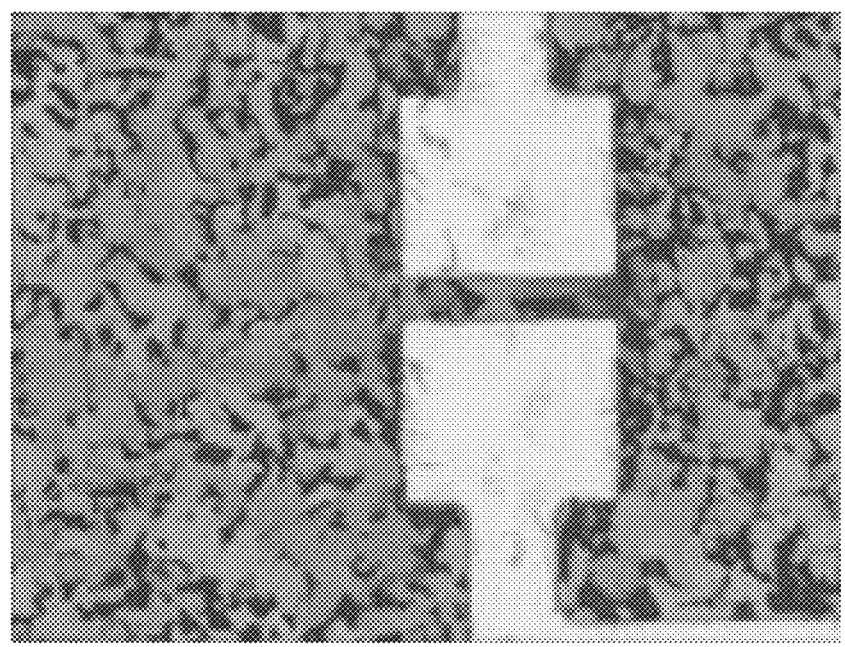
FIG. 16 is a 1000× magnification photograph of the active layer region of the thin film transistor according to Comparative Example 4.
Figure 17:
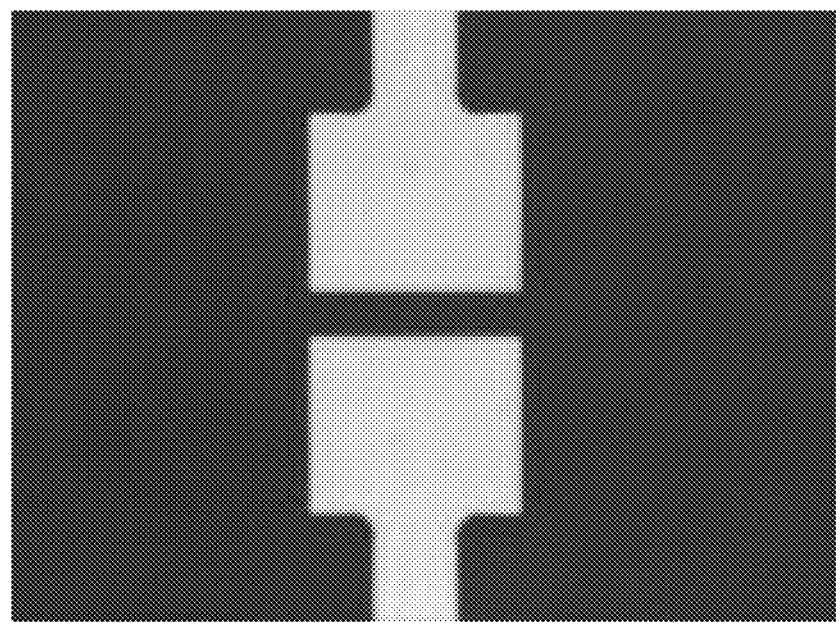
FIG. 17 is a 1000× magnification photograph of the active layer region of the thin film transistor according to Comparative Example 5.

FIG. 9 is a 50× magnification photograph of the active layer region of the thin film transistor according to Example 1, FIG. 10 is a 1000× magnification photograph of the active layer region of the thin film transistor according to Example 1, FIG. 11 is a 50× magnification photograph of the active layer region of the thin film transistor according to Comparative Example 2, FIG. 12 is a 1000× magnification photograph of the active layer region of the thin film transistor according to Comparative Example 2, FIG. 13 is a 50× magnification photograph of the active layer region of the thin film transistor according to Comparative Example 3, FIG. 14 is a 1000× magnification photograph of the active layer region of the thin film transistor according to Comparative Example 3, FIG. 15 is a 50× magnification photograph of the active layer region of the thin film transistor according to Comparative Example 4, FIG. 16 is a 1000× magnification photograph of the active layer region of the thin film transistor according to Comparative Example 4, and FIG. 17 is a 1000× magnification photograph of the active layer region of the thin film transistor according to Comparative Example 5.

Referring to FIGS. 9 and 10, the thin film transistor of Example 1 shows that an organic semiconductor is selectively deposited on an auxiliary structure and consecutively grows between a pair of auxiliary structure.

On the contrary, referring to FIGS. 11 to 17, the thin film transistors according to Comparative Examples 2 to 5 do not show that an organic semiconductors is not selectively deposited on and auxiliary structure and thus deposited on the whole surface of a substrate (Comparative Examples 2 and 4) or not deposited at all (Comparative Examples 3 and 5).

Evaluation II

Charge mobility of the thin film transistors according to Examples 1 and 2 and Comparative Example 1 is evaluated.

The charge mobility is obtained by obtaining a graph having $(I_{SD})^{1/2}$ and $V_G$ as variables from a saturation region current equation and a slope in the graph.

$$I_{SD} = \frac{WC_0}{2L}\mu(V_G - V_T)^2$$

$$\sqrt{I_{Sd}} = \sqrt{\frac{\mu C_0 W}{2L}}(V_G - V_T)$$

$$slope = \sqrt{\frac{\mu C_0 W}{2L}}$$

$$\mu_{FBT} = (slope)^2 \frac{2L}{C_0 W}$$

In the equations, $I_{SD}$ is a source-drain current, $\mu$ or $\mu_{FET}$ is charge mobility, $C_0$ is electrostatic capacity of a gate insulating layer, W is a channel width, L is a channel length, $V_G$ is a gate voltage, and $V_T$ is a threshold voltage.

The results are shown in Table 1.

TABLE 1

| | Charge mobility (cm²/Vs) |
|---|---|
| Example 1 | 10.2 |
| Example 2 | 14.1 |
| Comparative Example 1 | 2.1 |

Referring to Table 1, the thin film transistors according to Examples 1 and 2 show higher charge mobility than the thin film transistor according to Comparative Example 1.

While some example embodiments of inventive concepts have been described, it will be understood by one of ordinary skill in the art that variations in form and detail may be made therein without departing from the spirit and scope of the claims.

What is claimed is:

1. A thin film transistor comprising
a substrate;
a pair of auxiliary structures on the substrate,
the pair of auxiliary structures including a first auxiliary structure and a second auxiliary structure facing each other;
the first auxiliary structure including a lower surface and an upper surface facing each other, the lower surface of the first auxiliary structure facing a surface of the substrate,
the second auxiliary structure including a lower surface and an upper surface facing each other, the lower surface of the second auxiliary structure facing the surface of the substrate,
an active layer on the substrate, the active layer including an organic semiconductor that is contiguous between the first auxiliary structure and a second auxiliary structure;
a gate electrode overlapped by the active layer; and
a source electrode and a drain electrode electrically connected to the active layer so a portion of the source electrode and a portion of the drain electrode are arranged overlying the active layer,
wherein one edge of the active layer contacts at least a part of the upper surface of the first auxiliary structure and another edge of the active layer contacts at least a part of the upper surface of the second auxiliary structure, and
the active layer is continuously formed between the first auxiliary structure and the second auxiliary structure.

2. The thin film transistor of claim 1, wherein
a lower surface of the active layer contacts the first auxiliary structure and the second auxiliary structure, and
an upper surface of the active layer contacts the source electrode and the drain electrode.

3. The thin film transistor of claim 1, wherein the active layer is a single crystal active layer.

4. The thin film transistor of claim 1, wherein the pair of auxiliary structures include at least one of a metal a semimetal, an inorganic material, or an organic material.

5. The thin film transistor of claim 1, wherein an interval between the first auxiliary structure and the second auxiliary structure is greater than 0 μm and less than or equal to about 10 μm.

6. The thin film transistor of claim 1, wherein the organic semiconductor is a deposition-type organic semiconductor.

7. The thin film transistor of claim 1, wherein the organic semiconductor includes a structure represented by Chemical Formula 1 or 2:

[Chemical Formula 1]

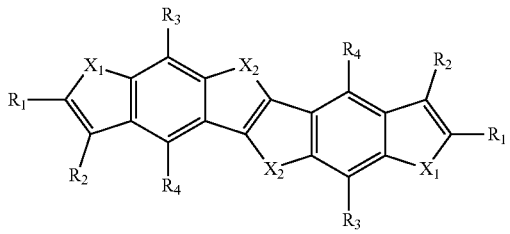

[Chemical Formula 2]

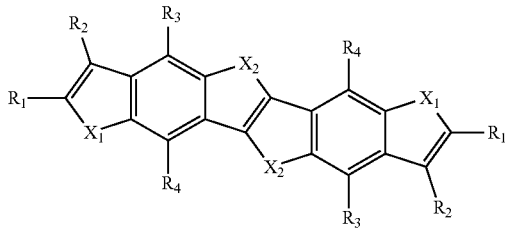

wherein, in Chemical Formula 1 or 2, $X_1$ and $X_2$ are independently S, Se, or Te, and $R_1$ to $R_4$ are independently hydrogen, a substituted or unsubstituted C1 to C30 alkyl group, a substituted or unsubstituted C2 to C30 alkenyl group, a substituted or unsubstituted C6 to C30 aryl group, a substituted or unsubstituted C3 to C30 heteroaryl group, or a combination thereof.

8. An electronic device comprising:
the thin film transistor of claim 1.

9. A thin film transistor comprising
a substrate;
a gate electrode on the substrate;
a pair of auxiliary structures on the substrate, the pair of auxiliary structures including a first auxiliary structure spaced apart from a second auxiliary structure;
the first auxiliary structure including a lower surface and an upper surface facing each other, the lower surface of the first auxiliary structure facing a surface of the substrate,
the second auxiliary structure including a lower surface and an upper surface facing each other, the lower surface of the second auxiliary structure facing the surface of the substrate,
an active layer on the substrate, the active layer including an organic semiconductor between the first auxiliary structure and the second auxiliary structure;
a source electrode and a drain electrode electrically connected to the active layer so a portion of the source electrode and a portion of the drain electrode are arranged overlying the active layer;
a gate insulating layer on the substrate, the gate insulating layer between the active layer and the gate electrode, the gate insulating layer extending between the gate electrode and the pair of auxiliary structures; and
a surface treatment layer on the substrate, the surface treatment layer between the active layer and the gate insulating layer, the surface treatment layer between the first auxiliary structure and the second auxiliary structure,
wherein one edge of the active layer contacts at least a part of the upper surface of the first auxiliary structure and another edge of the active layer contacts at least a part of the upper surface of the second auxiliary structure, and
the active layer is continuously formed between the first auxiliary structure and the second auxiliary structure.

10. The thin film transistor of claim 9, wherein
an interval between the pair of auxiliary structures is greater than 0 μm and less than or equal to about 10 μm.

11. The thin film transistor of claim 9, wherein the organic semiconductor includes a structure represented by Chemical Formula 1 or 2:

[Chemical Formula 1]

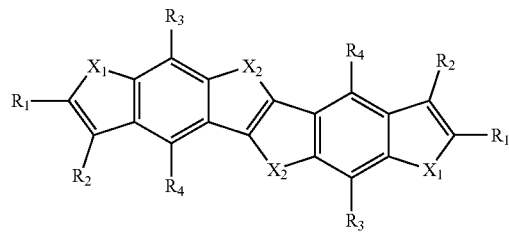

[Chemical Formula 2]

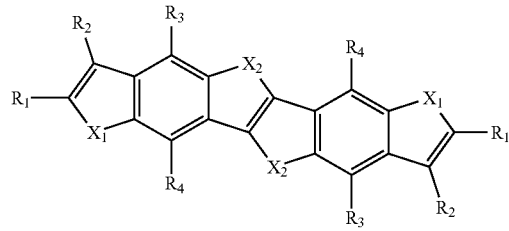

wherein, in Chemical Formula 1 or 2, $X_1$ and $X_2$ are independently S, Se, or Te, and $R_1$ to $R_4$ are independently hydrogen, a substituted or unsubstituted C1 to C30 alkyl group, a substituted or unsubstituted C2 to C30 alkenyl group, a substituted or unsubstituted C6 to C30 aryl group, a substituted or unsubstituted C3 to C30 heteroaryl group, or a combination thereof.

12. The thin film transistor of claim 9, wherein the pair of auxiliary structures include at least one of a metal, a semimetal, an inorganic material, or an organic material.

13. The thin film transistor of claim 9, wherein the surface treatment layer includes at least one of a silane compound or a thiol compound.

14. An electronic device comprising the thin film transistor of claim 9.

* * * * *